(12) United States Patent
Chen et al.

(10) Patent No.: US 11,197,396 B2
(45) Date of Patent: Dec. 7, 2021

(54) COOLING SYSTEM WITH CURVILINEAR AIR TO LIQUID HEAT EXCHANGER

(71) Applicant: Quanta Computer Inc., Taoyuan (TW)

(72) Inventors: Chao-Jung Chen, Taoyuan (TW); Yu-Nien Huang, Taoyuan (TW); Tsung-Ta Li, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 26 days.

(21) Appl. No.: 16/752,367

(22) Filed: Jan. 24, 2020

(65) Prior Publication Data
US 2021/0092877 A1 Mar. 25, 2021

Related U.S. Application Data

(60) Provisional application No. 62/903,249, filed on Sep. 20, 2019.

(51) Int. Cl.
*H05K 7/20* (2006.01)
*F28F 3/12* (2006.01)
*F28D 21/00* (2006.01)

(52) U.S. Cl.
CPC .......... *H05K 7/20763* (2013.01); *F28F 3/12* (2013.01); *H05K 7/20254* (2013.01); *F28D 2021/0031* (2013.01); *H05K 7/20718* (2013.01)

(58) Field of Classification Search
CPC .......... H05K 7/20772; H05K 7/20781; H05K 7/20254; H05K 7/20272; H05K 7/2039;
(Continued)

(56) References Cited

U.S. PATENT DOCUMENTS

| 6,755,137 B2 * | 6/2004 | Wentz | A47B 23/00 108/44 |
| 2005/0061473 A1 * | 3/2005 | Fletcher | F28D 9/0087 165/46 |

(Continued)

FOREIGN PATENT DOCUMENTS

JP        2001153387 A   *  6/2001
WO    WO-2005031240 A1 *  4/2005   .............. F28F 1/128

OTHER PUBLICATIONS

Taka original and English version of the reference (Year: 2001).*

*Primary Examiner* — Mandeep S Buttar
(74) *Attorney, Agent, or Firm* — Nixon Peabody LLP

(57) ABSTRACT

An equipment assembly for cooling heat-generating electrical components is disclosed. The assembly includes a housing for containing a heat-generating electrical component. The housing includes an open end having a planar area. A closed-loop liquid cooling system includes a liquid coolant conduit in proximity to the heat-generating electrical component. The conduit allows circulation of a liquid coolant to extract heat from the heat-generating electrical component. A heat exchanger is fluidly coupled to the liquid coolant conduit to extract heat from circulated liquid coolant within the heat exchanger. The heat exchanger includes a shaped front facing the open end of the housing. The surface area of the shaped front is greater than the planar area of the open end. An air flow system propels ambient air through the shaped front of the heat exchanger.

14 Claims, 6 Drawing Sheets

(58) Field of Classification Search
CPC .......... H05K 7/20809; H05K 7/20836; H05K 7/20263; H05K 7/20218; H05K 7/20509; H05K 7/20281; H05K 7/20718; H05K 7/20763; H05K 7/20827; H05K 7/20818; H05K 7/20636; H05K 7/20709; H01L 23/473; H01L 23/3672
USPC .......... 361/699, 701, 679.53, 689, 694, 720; 165/104.33, 80.2, 104.31, 173, 287, 165/104.28, 80.4; 29/890.03, 428
See application file for complete search history.

(56) References Cited

U.S. PATENT DOCUMENTS

| | | | |
|---|---|---|---|
| 2010/0011803 A1* | 1/2010 | Warnecker | F24F 1/12 62/498 |
| 2020/0154610 A1* | 5/2020 | Wilks | H05K 7/20818 |

\* cited by examiner

COOLING SYSTEM WITH CURVILINEAR AIR TO LIQUID HEAT EXCHANGER

PRIORITY CLAIM

The present disclosure claims priority to U.S. Provisional Application Ser. No. 62/903,249, filed Sep. 20, 2019. The contents of that application in its entirety are hereby incorporated by reference.

TECHNICAL FIELD

The present disclosure relates generally to a cooling system for a computer system. More particularly, aspects of this disclosure relate to a cooling system with a shaped surface on a liquid cooling heat exchanger to increase heat exchange capacity.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In rack level liquid cooling system designs, the cooling liquid source includes a closed loop cooling system and an open loop cooling system to facilitate heat exchange. Known closed loop liquid cooling systems use heat exchange to cool hot water which is heated from the heat source. Heat is then removed from the hot water in the closed loop liquid cooling system via an open loop system such as a fan wall. The cooling cycle of a prior art closed loop system 10 is shown in FIG. 1. The cooling system 10 includes a heat source 20 and a heat exchanger 22. A liquid flow pipe 24 carries coolant liquid to the heat source 20. Heat generated by the heat source 20 is transferred to the coolant liquid. A liquid flow pipe 26 carries heated liquid away from the heat source 22. The heat exchanger 22 has a series of metallic fins where the returned coolant flows. The fins transfer heat from the heated liquid and thus results in cooler liquid to be circulated to the liquid flow pipe 24. An open loop air cooling system, such as a fan array 30, generates air flow 32 that carries away heat absorbed by the fins of the heat exchanger 22.

Normal closed-loop heat exchangers are planar in shape and are typically mounted on a panel door of an equipment housing. The panel door also supports the fan array. This allows the fans of the fan array to blow air through the heat exchanger to carry away the heat absorbed from the liquid coolant flowing from the pipes. The number of fins that may be included in the heat exchanger, and thus the available cooling surface area, depends on the linear width of the heat exchanger.

FIG. 2A is a perspective view of a known rack housing 50 with the closed loop cooling system 10 shown in FIG. 1. FIG. 2B is an exploded view of the components in the rack housing 50 and the closed loop cooling system 10. FIG. 2C is a top view of the rack housing 50 with the heat exchanger 22. The rack housing 50 includes a cabinet 52 that may include slots that hold heat-generating electrical components such as servers 54. The rack housing 50 has a rear door 56 that may be opened, as shown in FIG. 2A, to provide access to the electronic components in the rack housing 50. In normal operation, the rear door 56 is closed, as shown in FIGS. 2B and 2C. When the door 56 is in the closed position, the heat exchanger 22 circulates coolant through hoses to remove heat generated by the electronic components in the rack housing 50.

The heat exchanger 22 is mounted on the rear door 56 along with the fan array 30. When the door 56 is closed, the fan array 30 creates the air flow 32 that forces air over the servers 54, as shown in FIG. 2B. The air is heated by the servers 54 (the heat source 20 in FIG. 1) and is directed through a series of cold plates circulating the coolant around the servers 54 to the heat exchanger 22. The heat is transferred to the coolant flowing out of the heat exchanger 22—from a cold liquid coolant connector 60, through the hose 24, and through the cold plates internal to the servers 54. The returned heated coolant from the hose 26 is connected to a hot coolant connector 62, and thus to the fins of the heat exchanger 22. The air flow 32 generated by the fan array 30 carries the hot air absorbed by the fins of heat exchanger 22 away through the door 56.

Normal heat exchanger designs, such as the heat exchanger 22, have a planar shape and are fixed on the rear door 56 as shown in FIGS. 2A-2C. Thus, the heat exchanger 22 has a flat rectangular surface 70 that faces the servers 54 in the rack housing. The amount of heat carried away by the heat exchanger is proportional to the surface area of the flat rectangular surface 70, as the width of the surface 70 determines how many fins may be mounted and therefore the available area exposed to airflow. However, conventional heat exchanger designs are becoming inadequate to meet the cooling needs of heat generated from faster servers.

Thus, there is a need to increase the performance of a door-mounted planar heat exchanger. There is another need to increase the heat radiation surface area of a heat exchanger to increase heat exchange. There is another need to increase the size of a heat exchanger to increase cooling capability.

SUMMARY

One disclosed example is an equipment assembly that includes a housing for containing a heat-generating electrical component. The housing includes an open end having a planar area. A closed-loop liquid cooling system includes a liquid coolant conduit in proximity to the heat-generating electrical component. The conduit allows circulation of a liquid coolant to extract heat from the heat-generating electrical component. A heat exchanger is fluidly coupled to the liquid coolant conduit to extract heat from circulated liquid coolant within the heat exchanger. The heat exchanger includes a shaped front facing the open end of the housing. The surface area of the shaped front is greater than the planar area of the open end. An air flow system propels ambient air through the shaped surface of the heat exchanger.

In another disclosed implementation of the example equipment assembly, the shaped front is a curvilinear shape. In another disclosed implementation, the shaped front includes at least two components, each having a flat exterior connected at an angle to each other. In another disclosed implementation, the liquid coolant conduit is coupled to a cooling plate. In another disclosed implementation, the heat exchanger includes a first side and a second side separated by a plurality of fins extending from the shaped front. In another disclosed implementation, the airflow system includes a plurality of fans in proximity to a rear surface of the heat exchanger and opposite the front. In another disclosed implementation, the housing includes a door having a closed position enclosing the open end, wherein the closed-loop liquid cooling system and the air flow system are mounted on the door.

Another disclosed example is a cooling system for circulating liquid coolant to remove heat generated by a heat-generating electronic component in an equipment rack. The equipment rack has an open end defined by a planar surface area. The cooling system includes a liquid coolant outlet to circulate a liquid coolant to extract heat from the heat-generating electrical component. A liquid coolant inlet collects the liquid coolant. A heat exchanger is fluidly coupled to the liquid coolant inlet and outlet to extract heat from circulated liquid coolant within the heat exchanger. The heat exchanger includes a shaped front facing the open end of the housing. The surface area of the shaped front is greater than the surface area of the plane. An airflow system is operable to propel ambient air through the shaped front of the heat exchanger.

In another disclosed implementation of the example cooling system, the shaped front is a curvilinear surface. In another disclosed implementation, the shaped front includes at least two components, each having a flat exterior connected at an angle to each other. In another disclosed implementation, the liquid coolant conduit is coupled to a cooling plate. In another disclosed implementation, the heat exchanger includes a first side and a second side separated by a plurality of fins extending from the shaped front. In another disclosed implementation, the airflow system includes a plurality of fans in proximity to a rear of the heat exchanger and opposite the front. In another disclosed implementation, the equipment rack includes a door having a closed position enclosing the open end, and wherein the cooling system is mounted on the door.

Another disclosed example is an equipment rack having a pair of side walls, a top panel, and a bottom panel. The top and bottom panels are attached to the side walls to define an open end. The side walls and panels provide support for a heat-generating electronic component mounted between the side walls. A door is attached to one of the side walls. The door has a curvilinear shape and a curvilinear interior surface. A fan wall is attached to the door. A heat exchanger includes an inlet fluid conduit and an outlet fluid conduit for circulating coolant fluid to the heat-generating electronic component. The heat exchanger is located between the interior surface of the door and the fan wall.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
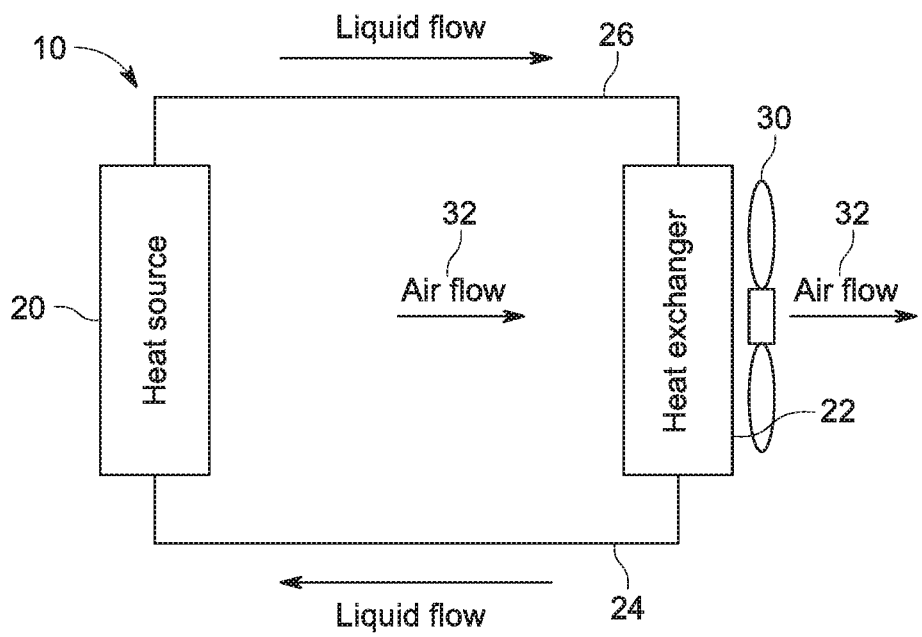
FIG. 1 is a block diagram of a prior art closed loop cooling system.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." More-over, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a closed-loop liquid cooling system having a heat exchanger with a shaped front such as a curvilinear shape. The shaped front has a greater surface area facing the open end of an equipment rack than the surface area of a flat plane facing the open end. The curvilinear front of the heat exchanger increases the performance of the heat exchanger by increasing the cooling surface relative to the surface area of the flat plane as more fins may be provided with the curvilinear front. The curvilinear front increases inlet airflow and cooling surface through the relatively greater number of fins. In comparison with known planar heat exchangers with a surface area of the flat plane facing the components in the equipment rack, the curvilinear front increases the available cooling surface by available fins by between 20-30%. Alternatively, a curvilinear shape may be created by multiple rectangular heat exchanger sections, arranged at angles to each other in a rough circular shape, to provide more fins. Another alternative may be shaping a support door mounting a heat exchanger to provide a curvilinear end for cooling.

Figure 3:
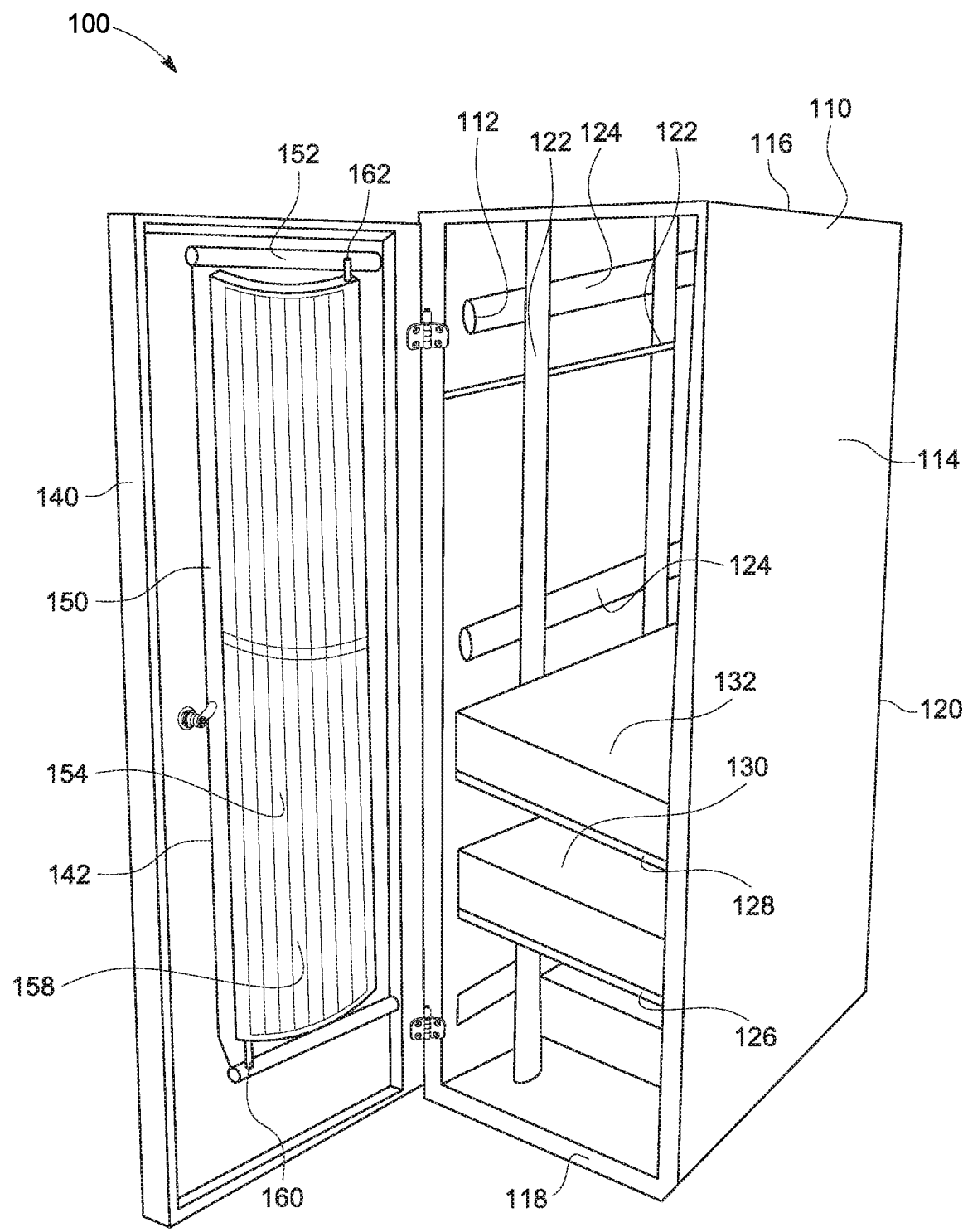
FIG. 3 is a perspective view of one example of an improved heat exchanger mounted in a rack, according to certain aspects of the present disclosure.
Figure 4A:
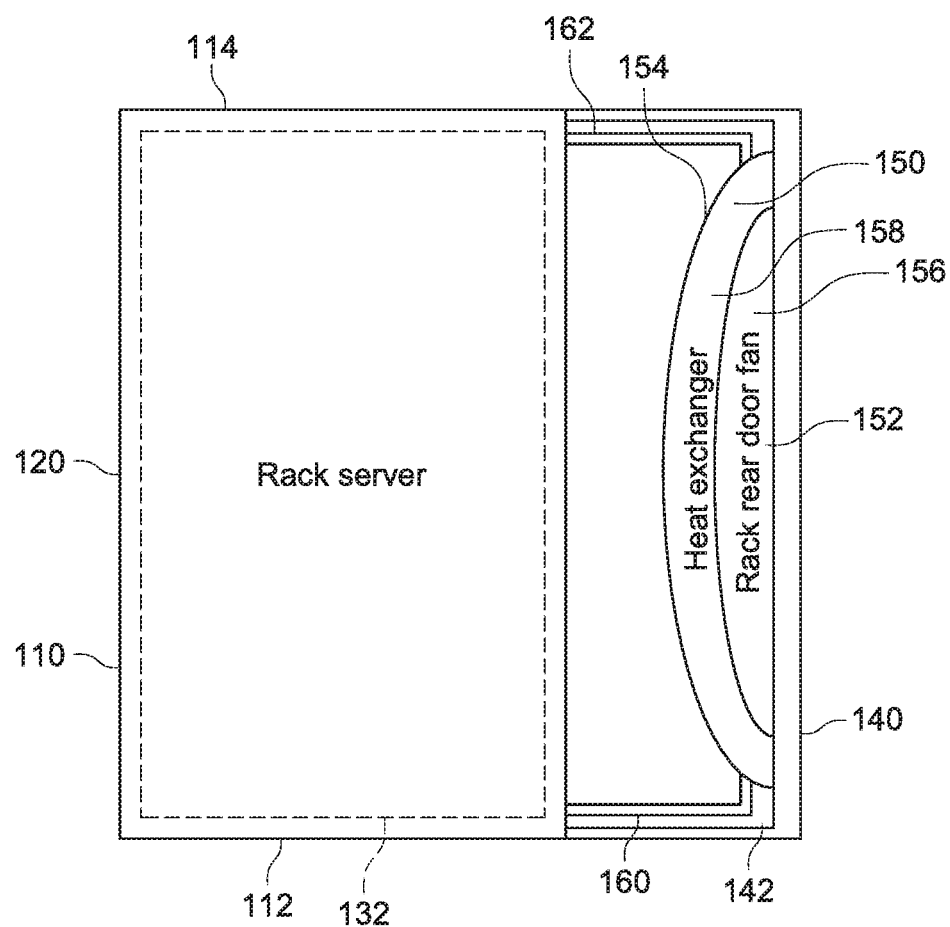
FIG. 4A is a top view of the example improved heat exchanger in FIG. 3, according to certain aspects of the present disclosure.

FIG. 3 is a perspective view of one example of an improved heat exchanger system 100. FIG. 4A is a top view of one example of the improved heat exchanger system 100. The improved heat exchanger system 100 is installed in a rack housing 110. The rack housing 110 includes two side walls 112 and 114 that are joined by top and bottom panels 116 and 118. A front wall 120 is joined to the side walls 112 and 114 to enclose the rack housing 110. A series of posts 122 and cross members 124 are attached to the side walls 112 and 114. The posts 122 and cross member 124 may contain multiple slots that allow the attachment of shelves between the walls 112 and 114. For example, different shelves, such as shelves 126 and 128, may be supported by the posts 122 at different heights. Further, the shelves may be arranged to have different heights between the shelves. The shelves such as the shelves 126 and 128 create different slots for the installation of heat-generating electrical components or devices such as servers 130 and 132. Although only two shelves and two servers are shown for simplicity, it is understood that any number of shelves and corresponding heat-generating electrical components may be installed in the rack housing 110.

The rack housing 110 has an open end opposite the front wall 120. A rear door 140 is attached to the side wall 112 via hinges that allow the rear door 140 to be swung between an open position shown in FIG. 3 to a closed position shown in FIG. 4A. Opening the rear door 140 allows access to the components in the rack housing 110 through the open end of the rack housing 110. The heat exchanger system 100 is mounted on the rear door 140. In this example, the heat exchanger system 100 is a closed loop liquid cooling system that cools the electronic components or devices, such as the servers 130 and 132, in the rack housing 110. Each of the heat-generating electrical components in the rack housing 110 has a liquid cooling conduit that allows circulation of a liquid coolant to extract heat from the heat-generating electrical components. In this example, the liquid coolant conduit is connected to cold plates that circulate liquid coolant to carry away heat generated by the internal components of the heat-generating electrical components in the rack housing 110. For example, cooling plates internally circulate the liquid coolant supplied by the heat exchanger system 100, and thus absorb heat generated by the components such as processors in the servers 130 and 132.

The rear door 140 has a flat interior surface 142 that supports a heat exchanger 150 of the heat exchange system 100 and a fan wall 152. The heat exchange system 100 includes the heat exchanger 150 in fluid communication with the liquid coolant conduits of the heat-generating electrical components in the rack housing 110. The fan wall 152 includes multiple fans that provide air flow from the front wall 120 of the rack housing 110 through the heat exchanger 150.

Figure 4B:
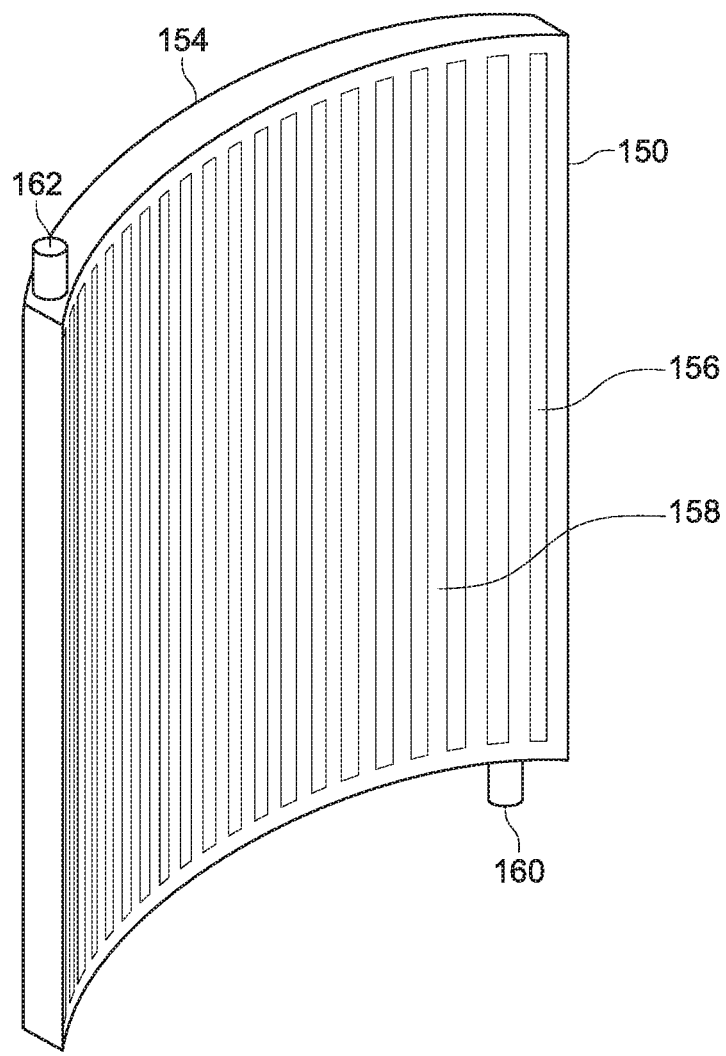
FIG. 4B is a perspective view of the example improved heat exchanger in FIG. 3.

FIG. 4B is a perspective view of the example heat exchanger 150. The heat exchanger 150 has a shaped front, such as a curvilinear front side 154, that generally faces the electronic components in the rack housing 110 when the rear door 140 is in the closed position. The curvilinear front side 154 is located a certain distance away from the electronic components when the rear door 140 (in FIG. 4A) is in the closed position. A curvilinear rear side 156 is in contact with the fan wall 152 (in FIG. 4A). Two sides of the heat exchanger 150 join the front side 154 to the rear side 156. Fins 158 separate the sides of the heat exchanger 150. The fins 158 are hollow and provide conduits for the returned heated coolant to flow. The curvilinear shape of the front and rear sides 154 and 156 allow comparatively more fins 158 to be provided. The additional fins provide more cooling surface area than a conventional linear design. The heat exchanger 150 is fluidly connected to an outlet fluid connector 160 and an inlet fluid connector 162. A pump (not shown) circulates the coolant between the heat exchanger 150 and the heat-generating electrical components in the rack housing 110.

The heat exchanger 150 extracts heat from the circulated liquid coolant within the heat exchanger 150. Thus, coolant circulates from the outlet connector 160 through the internal cold plates in the heat-generating electrical components in the rack housing 110 (in FIG. 4A). The coolant carries away heat generated by the electronic components in the rack housing 110. The heated coolant is returned through the inlet connector 162 to the heat exchanger 150. As the coolant circulates through the fins 158 of the heat exchanger 150, an air flow system, such as the fan wall 152, moves ambient air through the shaped front 154 of the heat exchanger 150 to carry away heat in the coolant in the fins 158, and lowers the temperature of the coolant. The cooled liquid coolant is then circulated back through the outlet connector 160.

The disclosed concept uses different shapes of the heat exchanger 150 to increase the performance of the heat exchanger 150 by allowing the provision of more fins and therefore more cooling surface area. The rear end of the rack housing 110 has a planar area shape defined by the side walls 112 and 114 and the panels 116 and 118. The planar area shape in this example is a flat rectangular plane having a surface area represented by a plane 400 in FIG. 4A. The flat plane 400 is approximately the surface area of a conventional heat exchanger facing the heat-generating electrical components in the rack housing 110, such as the heat exchanger 22 shown in FIG. 2C. In comparison, the surface area of the example heat exchanger 150 of the curvilinear front 154 is represented by a plane 410 in FIG. 5. The plane 410 represents the surface area of the curvilinear front 154 if the front 154 was flattened out. The surface area of the plane 410 is greater than the plane 400 due to the curvature of the front 154, and therefore allows the provision of comparatively more fins.

The heat exchanger 150 includes the curvilinear front side 154. The curvilinear front side 154 has more surface area (represented by the plane 410), in comparison with a flat surface in a conventional heat exchanger 22 shown in FIG. 2C (represented by the plane 400). In this example, the curvilinear front 154 provides more fins and increases the cooling surface area by 20%~30% more with the additional fins than the fins forming a flat surface in a normal design. The increased surface area of the additional fins of the heat exchanger 150 assists in transferring more heat from the circulated coolant out of the heat exchanger 150. The heat exchanger thermal solution with the fins forming the curvilinear front 154 can provide cooling to allow for 20% more system maximum power consumption by heat-generating electrical components in the rack housing 110, in comparison with that of a conventional design such as the heat exchanger 22 in FIG. 2C.

Figure 5:
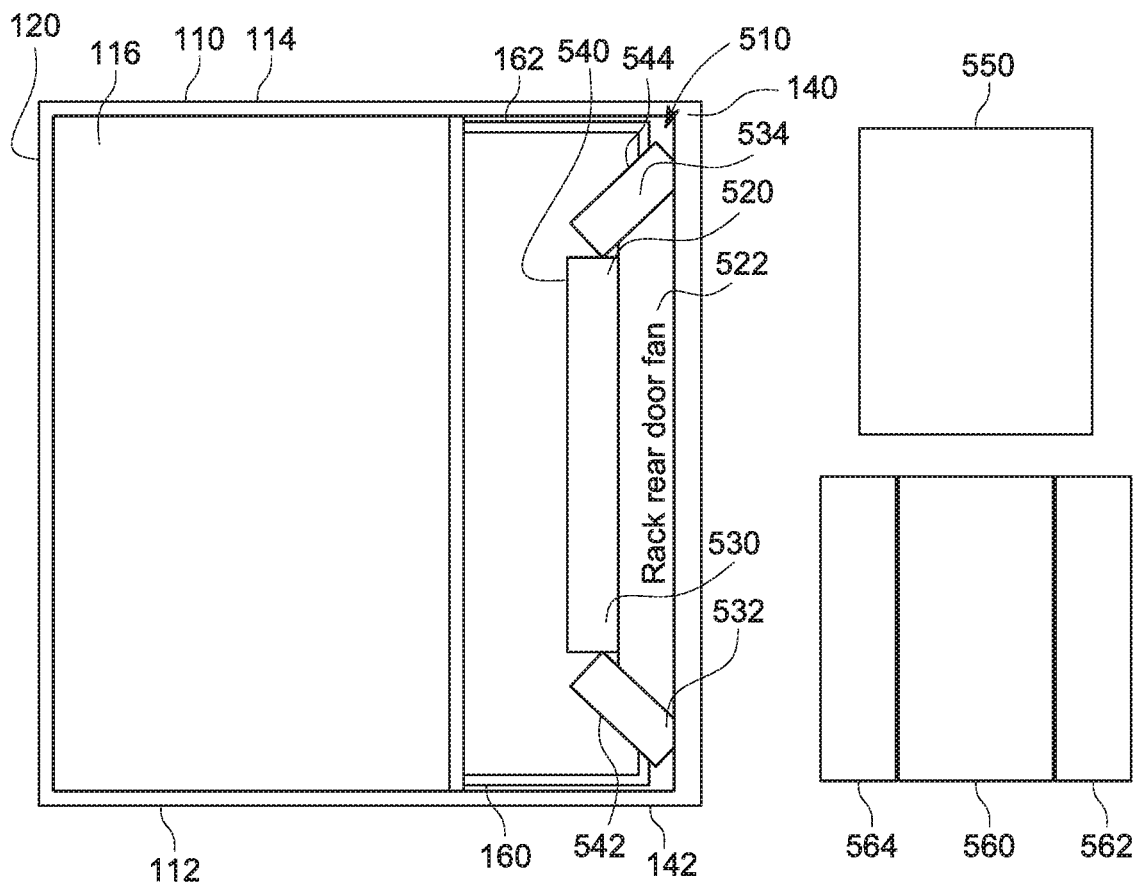
FIG. 5 is a top view of another example improved heat exchanger, according to certain aspects of the present disclosure.

FIG. 5 shows a top view of the equipment rack housing 110 in FIG. 3 with an alternate version of a heat exchanger system 510. Like elements in FIG. 5 are labeled with identical reference numbers as their counterparts in FIG. 3. The heat exchanger system 510 is mounted on the interior surface 142 of the rear door 140. The heat exchanger system 510 provides liquid coolant through the fluid outlet connector 160 (in FIG. 3) to cool heat-generating electrical components in the equipment rack housing 110. The heated coolant is circulated back to the heat exchanger system 510 via the fluid inlet connector 162.

The heat exchanger system 510 includes a heat exchanger 520 and a liquid coolant conduit that circulates coolant to cool the heat-generating electrical components in the equipment rack housing 110. An air flow system such as a fan wall 522 moves ambient air through the heat exchanger 520 to carry away heat in the coolant. The fan wall 522 includes multiple fans that provide air flow from the front wall 120 of the equipment rack housing 110 through the heat exchanger 520. The heat exchanger 520 includes three components 530, 532 and 534. The fan wall 522 is located between the three components 530, 532, and 534 and the rear door 140. The center component 530 has a flat exterior 540 that faces the electronic components of the equipment rack housing 110. Both of the other components 532 and 534 are attached to ends of the center component 530 at an angle. Both of the other components 532 and 534 have similar flat exteriors 542 and 544.

Figure 2A:
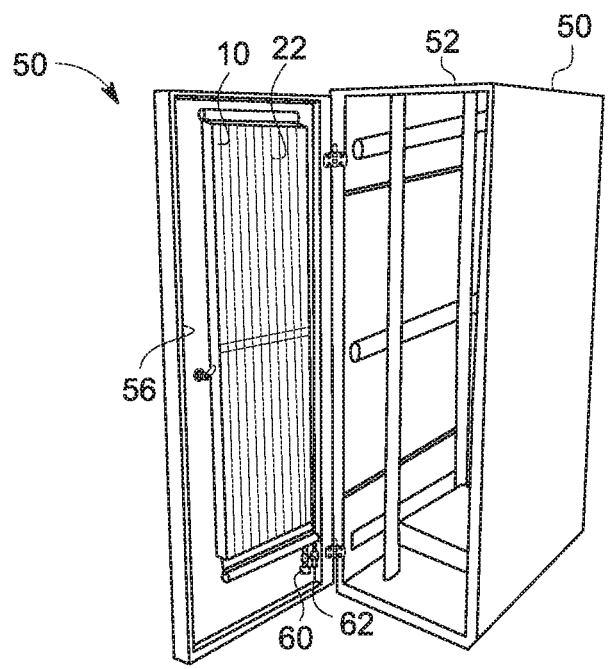
FIG. 2A is a perspective view of a known heat exchanger system on a rack housing.
Figure 2B:
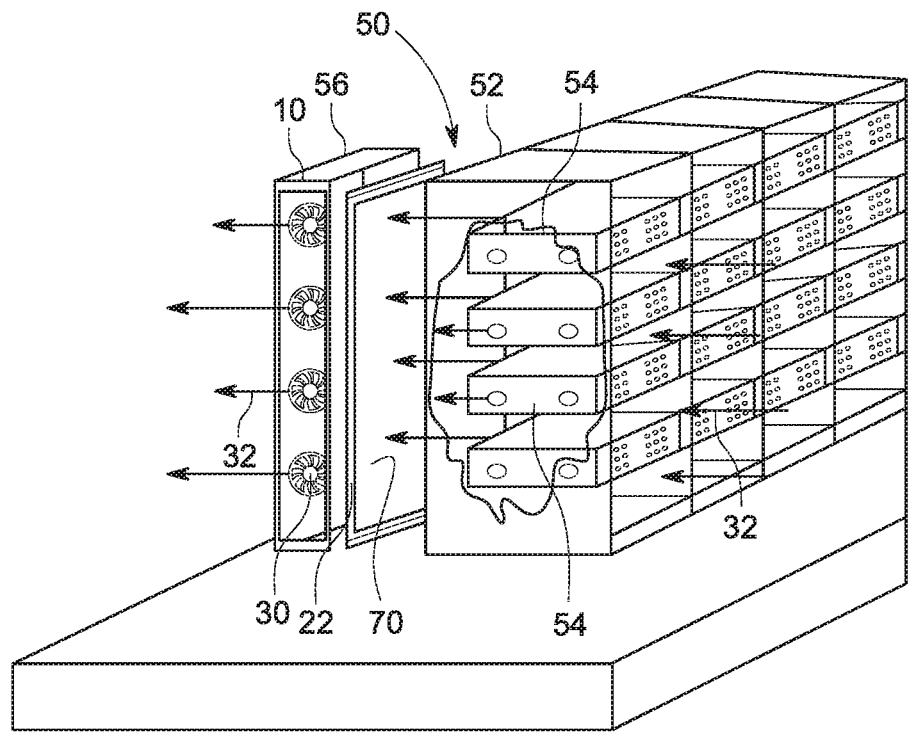
FIG. 2B is an exploded view of the components of the known heat exchanger system in FIG. 2A.
Figure 2C:
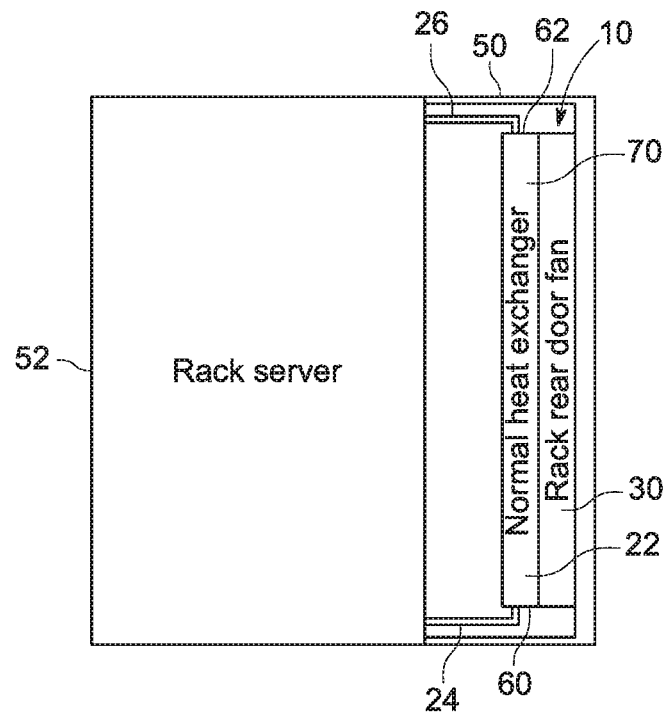
FIG. 2C is a top view of the known heat exchanger in FIG. 2A mounted on a rack housing door.

Since both components 532 and 534 are angled in relation to the center component 530, the combined surface area of the exteriors 540, 542 and 544 is greater than the surface area of a conventional heat exchanger such as the heat exchanger 22 in FIG. 2. As explained herein, a conventional heat exchanger has a surface area facing the components in the equipment rack defined by a flat plane having a shape of the open rear end of the equipment rack housing 110. The area of such a flat plane is defined in this example by a plane 550. The number of fins for the conventional heat exchanger is limited by the width of the plane 550. The overall surface area of the exteriors 540, 542, and 544 is larger as represented by planes 560, 562, and 564. As explained herein, the greater surface area from the exteriors 542 and 544 of the angled components allows more fins to be provided, and thus increases the cooling capacity of the heat exchanger system 510 with greater cooling surface areas. Of course, other components may be attached at angles to each other in order to further increase the surface area by providing more fins in contact with the exterior air flow.

Figure 6:
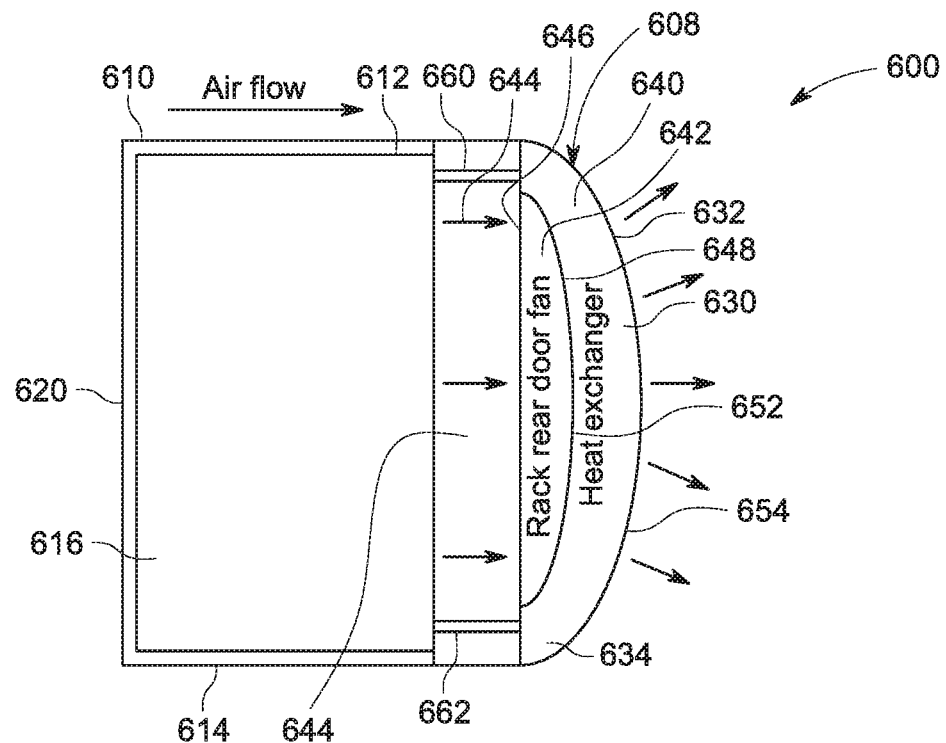
FIG. 6 is a top view of another example equipment rack assembly having an improved heat exchanger and shaped door, according to certain aspects of the present disclosure.

FIG. 6 is a top view of another example equipment rack assembly 600 having an improved heat exchanger and shaped door. The rack assembly 600 is based on a curvilinear rack door to support a curvilinear heat exchanger on a curvilinear interior surface of the door as is explained herein. The rack assembly 600 has a closed loop liquid heat exchanger system 608 and a rack housing 610.

The rack housing 610 includes two side walls 612 and 614 that are joined by a top panel 616 and a bottom panel. A front wall 620 is joined to the side walls 612 and 614 to encloses the rack housing 610. As explained herein, the interior of the side walls 612 and 614 may support posts and cross members to with multiple slots that allow the attachment of shelves between the walls 612 and 614. Heat-generating electrical components such as servers may be placed on the shelves between the walls 612 and 614.

The rack housing 610 has a rear door 630 that allows access to the heat-generating electrical components in the rack housing 610. The rear door 630 is attached to the side wall 612 via hinges that allow the rear door 630 to be swung between an open position and a closed position. The rear door 630 has a curvilinear panel 632. An interior surface 634 of the curvilinear panel 632 supports the heat exchanger system 608.

The heat exchanger system 608 is a closed loop liquid cooling system that cools the heat-generating electrical components, such as servers, in the rack housing 610. A series of hoses circulates liquid coolant to carry away heat generated by the heat-generating electrical components. The heat exchanger system 608 includes a heat exchanger 640 and a liquid coolant conduit that circulates coolant through the components in the rack housing 610. An air flow system, such as a fan wall 642, includes multiple fans that provide air flow from the front wall 620 of the equipment rack housing 610 through the heat exchanger 640, as represented by arrows 644. The fan wall 642 has a flat front panel 646 that includes multiple vents that access the fans in the fan wall. The fan wall 642 has an opposite curvilinear panel 648 that borders the heat exchanger 640.

The heat exchanger 640 has a generally semi-circular shape. The heat exchanger 640 has an interior curvilinear surface 652 in contact with the curvilinear panel 648 of the fan wall 642. An opposite curvilinear surface 654 is in contact with the interior surface 634 of the fan door 630. The heat exchanger 640 is fluidly connected to an outlet fluid connector 660 and an inlet fluid connector 662. A pump (not shown) circulates the coolant between the heat exchanger 640 and the electrical heat-generating components in the equipment housing 610.

Thus, coolant circulates from the outlet connector 660 through the network of hoses that provide coolant to internal cold plates in the heat-generating electrical components in the rack housing 610. The coolant carries away heat generated by the heat-generating electrical components in the rack housing 610. The heated coolant is returned through the inlet connector 662 to the heat exchanger 640. As the coolant circulates through the fins of the heat exchanger 640 between the curvilinear surfaces 652 and 654, air flow generated by the fan wall 642 flows from the front panel 646 through the curvilinear surface 652 of the heat exchanger 640 to carry away heat in the coolant in the fins, thus lowering the temperature of the coolant. The cooled liquid coolant is circulated back through the outlet connector 660.

The curvilinear panel 632 of the rear door creates extra space for the heat exchanger 640. Thus, the fans in the fan wall 642 push air through the heat exchanger 640 rather than pulling air through the heat exchanger as in the example systems in FIGS. 3-5. The curvilinear rear door shape allows an increase in the size of the heat exchanger 640 to fill the increased space between the rack housing 610 and rack rear door 630, due to the curvilinear shape of the door 630. Thus, this concept will increase the performance of the heat exchanger 640 due to its increase in size and therefore the increase in the number of fins that may be provided.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An equipment assembly, comprising:
    a housing for containing a heat-generating electrical component, the housing including an open end having a planar area defining a single side of the housing;
    a closed-loop liquid cooling system comprising:
        a liquid coolant conduit in proximity to the heat-generating electrical component allowing circulation of a liquid coolant to extract heat from the heat-generating electrical component; and
        a heat exchanger fluidly coupled to the liquid coolant conduit to extract heat from circulated liquid coolant within the heat exchanger, wherein the heat exchanger includes a shaped front, an opposite shaped rear, and a plurality of rectangular fins extending between the shaped front and shaped rear providing conduits for the circulated liquid coolant, the shaped front having a surface area only facing the open end single side of the housing, the surface area of the shaped front being greater than the planar area of the open end; and
    an air flow system operable to propel ambient air through the shaped front of the heat exchanger.

2. The equipment assembly of claim 1, wherein the shaped front is a curvilinear shape.

3. The equipment assembly of claim 1, wherein the shaped front includes at least two components each having a flat exterior connected at an angle to each other.

4. The equipment assembly of claim 1, wherein the liquid coolant conduit is coupled to a cooling plate.

5. The equipment assembly of claim 1, wherein the heat exchanger includes a first side and a second side separated by the plurality of fins.

6. The equipment assembly of claim 1, wherein the airflow system includes a plurality of fans in proximity to a rear surface of the rear of the heat exchanger and opposite the front.

7. The equipment assembly of claim 1, wherein the housing includes a door having a closed position enclosing the open end, wherein the closed-loop liquid cooling system and the air flow system are mounted on the door.

8. A cooling system for circulating liquid coolant to remove heat generated by a heat-generating electronic component in an equipment rack having a housing with an open end defined by a planar surface area defining a single side of the housing, the cooling system comprising:
    a liquid coolant outlet to circulate a liquid coolant to extract heat from the heat-generating electrical component;
    a liquid coolant inlet to collect the liquid coolant;
    a heat exchanger fluidly coupled to the liquid coolant inlet and outlet to extract heat from circulated liquid coolant within the heat exchanger, wherein the heat exchanger includes a shaped front, an opposite shaped rear, and a plurality of rectangular fins extending between the shaped front and shaped rear providing conduits for the circulated liquid coolant, the shaped front having a surface area only facing the open end single side of the housing, the surface area of the shaped front being greater than the planar surface area of the open end; and
    an airflow system operable to propel ambient air through the shaped front of the heat exchanger.

9. The cooling system of claim 8, wherein the shaped front is a curvilinear surface.

10. The cooling system of claim 8, wherein the shaped front includes at least two components each having a flat exterior connected at an angle to each other.

11. The cooling system of claim 8, wherein the liquid coolant conduit is coupled to a cooling plate.

12. The cooling system of claim 8, wherein the heat exchanger includes a first side and a second side separated by the plurality of fins.

13. The cooling system of claim 8, wherein the airflow system includes a plurality of fans in proximity to a rear surface of the rear of the heat exchanger and opposite the front.

14. The cooling system of claim 8, wherein the equipment rack includes a door having a closed position enclosing the open end, and wherein the cooling system is mounted on the door.

* * * * *